United States Patent
Ho et al.

(10) Patent No.: US 6,808,102 B1
(45) Date of Patent: Oct. 26, 2004

(54) WIRE-BONDING APPARATUS WITH IMPROVED XY-TABLE ORIENTATION

(75) Inventors: Wing Cheung Ho, Kwai Chung (HK); Siu Yan Ho, Kwai Chung (HK); Hon Shing Law, Kwai Chung (HK); Siu Wai Chung, Kwai Chung (HK)

(73) Assignee: ASM Assembly Automation Ltd., Kwai Chung (HK)

( * ) Notice: Subject to any disclaimer, the term of this patent is extended or adjusted under 35 U.S.C. 154(b) by 0 days.

(21) Appl. No.: 09/649,084

(22) Filed: Aug. 28, 2000

(51) Int. Cl.$^7$ .......................... B23K 37/00; B23K 31/02
(52) U.S. Cl. ..................................... 228/4.5; 228/180.5
(58) Field of Search ................................ 228/4.5, 180.5

(56) References Cited

U.S. PATENT DOCUMENTS

| | | | | |
|---|---|---|---|---|
| 3,941,985 A | * | 3/1976 | Kawase et al. | 198/341.05 |
| 4,039,114 A | * | 8/1977 | Yoshida et al. | 228/1.1 |
| 4,073,424 A | * | 2/1978 | Kulicke et al. | 228/102 |
| 4,239,144 A | * | 12/1980 | Elles et al. | 156/580.1 |
| 4,361,261 A | * | 11/1982 | Elles et al. | 228/103 |
| 4,422,568 A | * | 12/1983 | Elles et al. | 228/111 |
| 4,550,871 A | * | 11/1985 | Chan et al. | 228/180.21 |
| 4,619,395 A | * | 10/1986 | Amorosi et al. | 228/4.5 |
| 4,817,848 A | * | 4/1989 | Gabaldon | 228/102 |
| 5,465,899 A | * | 11/1995 | Quick et al. | 228/180.5 |
| 5,702,049 A | * | 12/1997 | Biggs et al. | 228/105 |
| 5,890,643 A | * | 4/1999 | Razon et al. | 228/1.1 |
| 5,897,048 A | * | 4/1999 | Cheng et al. | 228/180.5 |
| 6,112,973 A | * | 9/2000 | Hortaleza et al. | 228/180.5 |
| 6,367,685 B1 | * | 4/2002 | Jiang et al. | 228/180.5 |

FOREIGN PATENT DOCUMENTS

JP   10-303241 A  * 11/1998

* cited by examiner

Primary Examiner—L. Edmondson
(74) Attorney, Agent, or Firm—Burns, Doane, Swecker & Mathis, L.L.P.

(57) ABSTRACT

Wedge wire bonding apparatus are disclosed with an improved configuration in which the transducer axis lies on a line that bisects the XY axes, and the operator views the bonding process by looking directly along the axis of the transducer. The result is a shorter bonding cycle time as time is saved as the bonding head moves from a first to a second bonding position while at the same time the operator is placed in the best possible position for viewing the bonding operation, which facilitates in particular any necessary alignment and set-up steps.

12 Claims, 3 Drawing Sheets

WIRE-BONDING APPARATUS WITH IMPROVED XY-TABLE ORIENTATION

FIELD OF THE INVENTION

This invention relates to a wedge wire bonding apparatus, and in particular to such an apparatus having an improved xy-table orientation.

BACKGROUND OF THE INVENTION

Wire bonding apparatus for the bonding of semiconductor and other electronic components on to an integrated circuit board are generally divided into two types; ball bonding apparatus in which a ball, for example, of gold, is formed at the end of a wire to be bonded, and wedge wire bonding apparatus in which a wire is deformed as it is bonded.

Ball bonding apparatus require the bonding head to be movable in the three axes X, Y and Z. For wedge wire bonding apparatus, however, the workpiece or bonding head must also be orientable about its axis θ. For example, if a wire is being bonded at two places, before the first bond is made, the workpiece is rotated so that the bonding head is aligned with a line joining the first and second bonds then, after the first bond has been made, the bonding head is moved towards the second bonding location. Of course it will be appreciated that it is relative movement of the bondhead and the workpiece that is necessary. One may be fixed and the other may move, or vice versa.

PRIOR ART

FIGS. 1 to 3 show in plan and perspective views three conventional configurations for such wire bonding apparatus. Referring firstly to FIG. 1, a workpiece 1 is mounted on rotatable table 2. Rotatable table 2 is in turn mounted on sliding tables 3, 4 that are adapted to move in mutually orthogonal X and Y axes. Located above the workpiece 1 is a bonding head 5 including a transducer 6 that extends along an axis. The bonding head 5 is adapted to move vertically along the Z axis by means of a sliding mechanism disposed on the side of a bonding head supporting member 7. In the prior art configuration of FIG. 1 it will be noted that the transducer 6 is supported such that it is parallel with the x axis.

In use, before a first bond had been made, the axis of the transducer 6 is aligned along the direction of a line between the first and the second bonds by rotating the workpiece using the rotating table. After the first bond is formed, the workpiece 1 is then moved along the X axis by sliding table 3 until the workpiece 1 is in the correct position for the bonding head 5 to carry out the second bond. The bonding head moving down in the Z direction forms the bond, and the bonding head moves up again in the Z direction after the bond has been formed.

In the prior art bonding apparatus of FIG. 1 it will be noted that the bonding head supporting member 7 is located in the space defined by the interior angle of the XY axes and that the transducer axis is parallel to the X axis of the moving table 3. The prior art configuration of FIG. 2 is similar to FIG. 1 except that in this configuration the transducer axis is parallel to the Y axis of moving table 4. In the prior art configuration of FIG. 2, after the workpiece has been rotated so that the positions of the first and second bonds have been aligned with the transducer 6, the workpiece 1 is moved along the Y axis by means of sliding table 4.

FIG. 3 shows an alternate prior art configuration in which the bonding head supporting member 7 is located outside of the interior angle defined the XY axes and the transducer 6 is orientated such that the transducer axis is perpendicular to a line bisecting the XY axes. In this prior art configuration, after the work piece has been rotated so that the transducer 6 is aligned with the first and second bond locations, the work piece is moved along both the X and Y axes to move the work piece into the correct position for the second bond to be formed.

It should be noted that in the prior conventional arrangements as shown in FIGS. 1 to 3, the position of the operator of the bonding apparatus is such that he looks at the bonding apparatus from a position by the side of the X axis and views the bonding operation along a direction perpendicular to the X axis. It is also important to note that in the prior art arrangement of FIG. 3 an operator views the bonding process at an angle of 45° to the transducer axis which makes it difficult to properly observe the bonding process, and in particular makes it difficult to carry out necessary alignment and set-up steps.

SUMMARY OF THE INVENTION

It is an object of the invention to provide improved configurations for wedge wire bonding apparatus that provide more efficient operation.

According to the present invention therefore there is provided wedge wire bonding apparatus comprising:

(a) means for supporting a workpiece, (b) a bonding head including a transducer having a longitudinal axis, (c) means for causing relative movement of the workpiece and the transducer along orthogonal X and Y axes simultaneously, and (d) means for supporting the bonding head above the workpiece such that the longitudinal axis of said transducer lies along a line dividing said X and Y axes.

An advantage of the present invention in its preferred forms is that by moving the transducer relative to the workpiece along both the X and Y axes simultaneously, rather than only one of the two axes, the time spent for the movement of the transducer is significantly reduced. The maximum reduction in the travelling time of either the transducer or the workpiece (depending on which actually moves) is when the line bisects the X and Y axes equally making an angle of 45° to the X and Y axes and the travelling distance is reduced by a factor of 0.707 compared with when the movement is along one axis only. This reduces the Travelling time by nearly 30%. The relative XY motion of the transducer and the workpiece is not of course the only time consuming part of the bonding operation, nonetheless it is a major one (30–50% of the cycle) and the total bonding cycle time can be reduced by around 9 to 15%.

In one embodiment of the invention the workpiece supporting means comprises a rotary table for rotating the workpiece.

In one embodiment, the bonding head is fixed and the workpiece supporting table moves in the X and Y axes. Alternatively, the workpiece supporting table is fixed in the X and Y axes and the bonding head moves in the X and Y axes.

It is also possible to optimise the position of an operator viewing the bonding process. In particular in a preferred embodiment of the invention that apparatus includes a position for an operator to observe the bonding procedure, and wherein the transducer is positioned so as to point in the direction of the operator position. This is an optimum position in that it allows the operator to observe fully the bonding process and greatly facilitates any required alignment and set-up operations that are necessary at the commencement of or during a bonding process.

BRIEF DESCRIPTION OF THE DRAWINGS

Some embodiments of the invention will now be described by way of example and with respect to the accompanying drawings, in which.

DETAILED DESCRIPTION OF PREFERRED EMBODIMENTS

Figure 4:
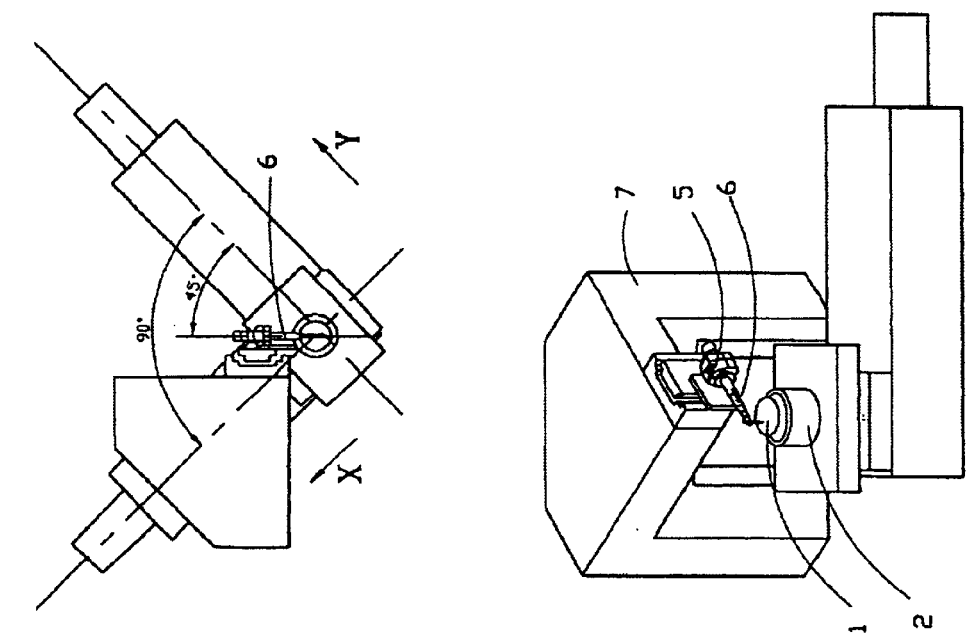
FIG. 4 is a perspective view and a plan view from above of a first configuration in accordance with an embodiment of the invention.

Referring firstly to FIG. 4, it will be seen that in this first embodiment of the invention it will be seen that the bonding head supporting member 7 is located such that when viewed in plan the transducer 6 is located within the interior angle of the X and Y axes and such that the longitudinal axis of the transducer 6 is located on a line that bisects the X and Y axes and forms an angle of 45° to each of them (or is located on a line closely adjacent and parallel to such a line). In this embodiment, before the first bond has been formed, the transducer axis is aligned with the first and second bond locations by rotating of the workpiece, and then after forming the first bond the work piece is moved simultaneously along both X and Y axes until the bonding head 5 is located above the second bond point and the second bond can be formed.

By arranging the transducer axis to be at 45° to both the X and Y axis and by moving the bonding head 5 along both axes simultaneously rather than just one of the two axes, the travelling distance in the X and Y axes of the bonding head can be reduced by a factor of 0.707 (i.e. sin 45°) compared with a prior art configuration in which the transducer is positioned parallel to one of the two axes. Furthermore by locating operator in a position so as to view the bonding operation along the transducer axis as shown by the arrow in FIG. 5, whereby the operator looks along the transducer axis, an optimum position is provided for an operator to be able to observe the bonding process, and to carry out any necessary alignment or set-up procedures either before commencement of or during the bonding process.

Figure 5:
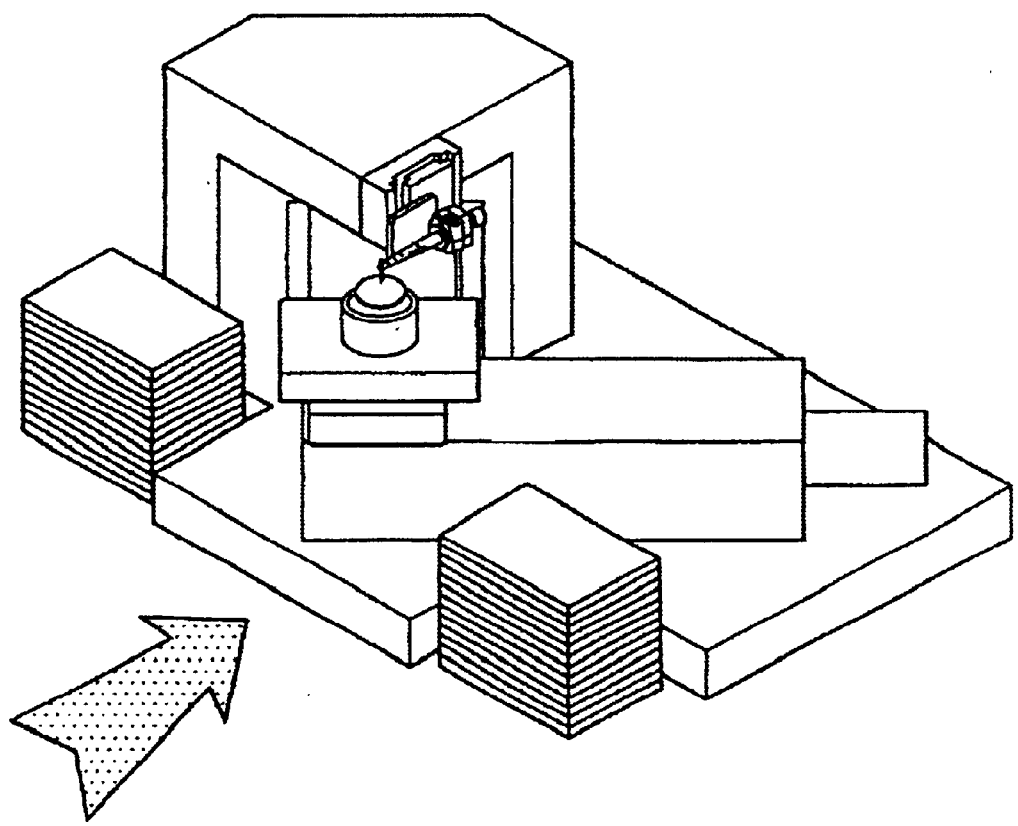
FIG. 5 is a perspective view of a wire bonding apparatus embodying the configuration of FIG. 4.

In the embodiment of FIGS. 4 and 5, rotation of the workpiece relative to the transducer is accomplished by rotating the workpiece itself while keeping the transducer 6 fixed, and then this is followed by moving the workpiece along the X and Y axes again keeping the transducer 6 fixed. In the embodiment of FIG. 6, the workpiece is again supported on a rotary supporting table to provide the desired movement about the θ axis. In this embodiment it is the transducer 6 that moves relative to the workpiece along the X and Y axes. This is achieved by fixing the bonding head supporting member 7 on one of the sliding tables 4 such that the orientation of the bonding head 5 relative to the X and Y axes is always fixed with the transducer axis being on a line that bisects the X and Y axes at 45° to each, though in this embodiment the transducer is directed so as to point towards the operator and away from the X and Y tables. The workpiece 1 is supported on a rotary table 10 fixed in the X and Y axes.

Figure 1:
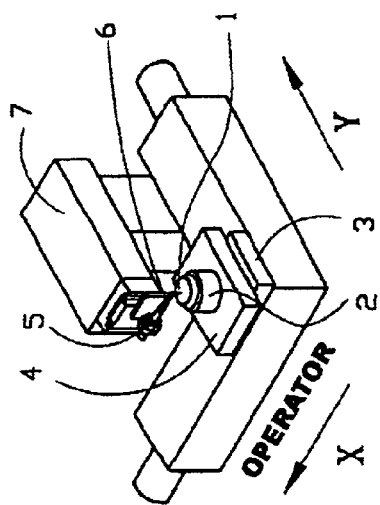
FIGS. 1 to 3 are plan views from above of the configuration of the three examples of the prior art.
Figure 1:
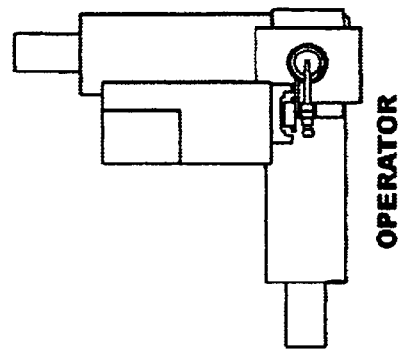
Figure 2:
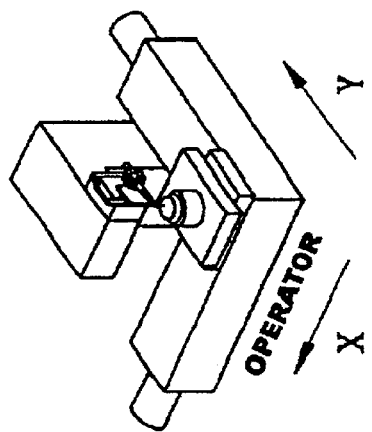
Figure 2:
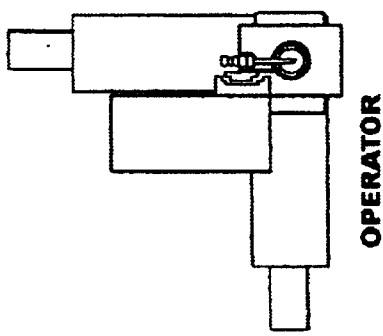
Figure 3:
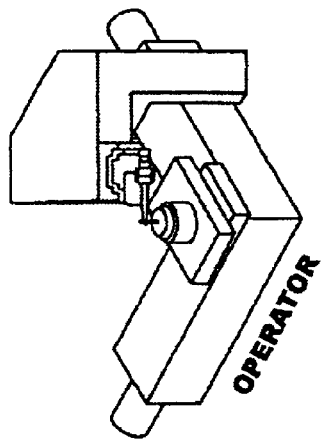
Figure 3:
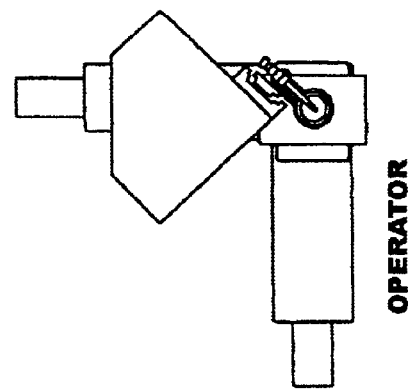
Figure 6:
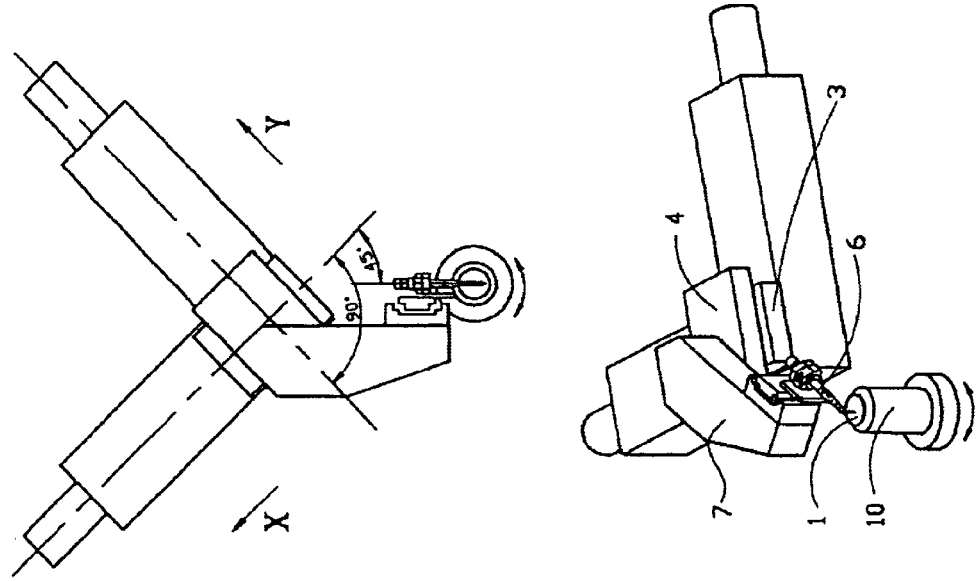
FIG. 6 is a perspective view and a plan view from above of a second configuration in accordance with a further embodiment of the invention.

In the embodiment of FIG. 6, before a first bond has been made the first and second bond locations are aligned with the axis of the transducer 6 by rotation of the workpiece supporting table 10 relative to the bonding head 5. When this alignment has been accomplished, the first bond is formed and then the bonding head 5 is moved to the second bonding position by movement along both the X and Y axes by sliding tables 3 and 4.

It will be understood that optimum results are obtained if the transducer axis bisects the X and Y axes at 45° to each axis. But an improvement can still be obtained if the transducer axis is located on a line that divides the X and Y axes other than by an equal bisection.

What is claimed is:

1. Wedge wire bonding apparatus comprising:
   (a) means for supporting a workpiece,
   (b) a bonding head including a transducer having a longitudinal axis,
   (c) means for causing relative movement of the workpiece and the transducer along an X axis,
   (d) means for causing relative movement of the workpiece and the transducer along a Y axis orthogonal to said X axis, and
   (e) means for maintaining the bonding head in a stationary orientation above the workpiece such that the longitudinal axis of said transducer remains fixed along a line dividing said X and Y axes at all times during relative positioning of the workpiece and the transducer, for each wire bonding operation.

2. Apparatus as claimed in claim 1 wherein the line dividing the X and Y axes makes an angle of 45° to the X and Y axes.

3. Apparatus as claimed in claim 1 wherein said workpiece supporting means comprises a rotary table for rotating said workpiece.

4. Apparatus as claimed in claim 1, wherein said bonding head is fixed relative said X and Y axes and wherein means are provided for moving said workpiece along said X and Y axes.

5. Apparatus as claimed in claim 1, wherein said workpiece supporting means is fixed relative to said X and Y axes and wherein means are provided for moving said bonding head along said X and Y axes.

6. Apparatus as claimed in claim 1 wherein said apparatus includes a position for all operator to observe the bonding process and wherein the transducer is positioned so as to point in the direction of the operator position.

7. Apparatus as claimed in claim 2 wherein said workpiece supporting means comprises a rotary table for rotating said workpiece.

8. Apparatus as claimed in claim 2, wherein said bonding head is fixed relative to said X and Y axes and wherein means are provided for moving said workpiece along said X and Y axes.

9. Apparatus as claimed in claim 2 wherein said workpiece supporting means is fixed relative to said X and Y axes and wherein means are provided for moving said bonding head along said X and Y axes.

10. Apparatus as claimed in claim 3, wherein said bonding head is fixed relative to said X and Y axes and wherein means are provided for moving said workpiece along said X and Y axes.

11. Apparatus as claimed in claim 3 wherein said workpiece supporting means is fixed relative to said X and Y axes and wherein means are provided for moving said bonding head along said X and Y axes.

12. An apparatus as claimed in claim 1, wherein said means for causing relative movement of the workpiece and the transducer cause movement to occur simultaneously along both the X and Y axes.

* * * * *